United States Patent
Park et al.

(10) Patent No.: US 9,646,884 B2
(45) Date of Patent: May 9, 2017

(54) BLOCK LEVEL PATTERNING PROCESS

(71) Applicant: GLOBALFOUNDRIES Inc., Grand Cayman (KY)

(72) Inventors: Chanro Park, Clifton Park, NY (US); Sukwon Hong, Albany, NY (US); Hoon Kim, Clifton Park, NY (US); Min Gyu Sung, Latham, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 44 days.

(21) Appl. No.: 14/699,122

(22) Filed: Apr. 29, 2015

(65) Prior Publication Data

US 2016/0322260 A1 Nov. 3, 2016

(51) Int. Cl.
| | |
|---|---|
| H01L 21/8234 | (2006.01) |
| H01L 21/3213 | (2006.01) |
| H01L 21/027 | (2006.01) |
| H01L 21/28 | (2006.01) |

(52) U.S. Cl.
CPC ........ *H01L 21/823431* (2013.01); *H01L 21/28088* (2013.01); *H01L 21/32139* (2013.01); *H01L 21/823462* (2013.01); *H01L 21/823481* (2013.01)

(58) Field of Classification Search
CPC ..... H01L 21/823456; H01L 21/823431; H01L 21/823437; H01L 21/0276; H01L 21/32139
See application file for complete search history.

(56) References Cited

U.S. PATENT DOCUMENTS

| | | | | |
|---|---|---|---|---|
| 2007/0052037 | A1* | 3/2007 | Luan | H01L 21/82382 257/369 |
| 2010/0163926 | A1* | 7/2010 | Hudait | H01L 29/1054 257/190 |
| 2013/0214382 | A1* | 8/2013 | Wang | H01L 21/743 257/506 |
| 2015/0195916 | A1* | 7/2015 | Cheng | G03F 7/0002 216/47 |

* cited by examiner

*Primary Examiner* — Michael Carter
(74) *Attorney, Agent, or Firm* — Ditthavong & Steiner, P.C.

(57) ABSTRACT

The present application relates to an optical planarizing layer etch process. Embodiments include forming fins separated by a dielectric layer; forming a recess in the dielectric layer on each side of each fin, each recess being for a metal gate; forming sidewall spacers on each side of each recess; depositing a high-k dielectric liner in each recess and on a top surface of each of the fins; depositing a metal liner over the high-k dielectric layer; depositing a non-conformal organic layer (NCOL) over a top surface of the dielectric layer to pinch-off a top of each recess; depositing an OPL and ARC over the NCOL; etching the OPL, ARC and NCOL over a portion of the dielectric layer and recesses in a first region; and etching the portion of the recesses to remove residual NCOL present at a bottom of each recess of the portion of the recesses.

20 Claims, 9 Drawing Sheets

(BACKGROUND)

(BACKGROUND)

BLOCK LEVEL PATTERNING PROCESS

TECHNICAL FIELD

The present disclosure generally relates to semiconductor fabrication etch process methodology, and, more specifically, relates to an optical planarizing layer etch process methodology. The present disclosure is particularly applicable to devices for the 14 nanometer (nm) technology node and beyond.

BACKGROUND

In a conventional patterning process, an optical planarizing layer (OPL) and anti-reflective coating (ARC) are used together to lithographically define an open area. The OPL and ARC, are subsequently removed by plasma etching or reactive ion etching. A metal layer in the open area is then removed by a wet etching technique. However, with this conventional process, it is difficult to control OPL critical dimension (CD) and profile at the critical block level. An undesirably long over-etch, e.g. 30% or more, is necessary to completely remove the OPL at bottoms of the recesses. Any remaining OPL residue at the bottoms of the recesses will block or prevent the wet etching underneath the residual OPL, such as an underlying metal layer. Moreover, there is risk of damaging the channels with an aggressive over-etching, and the OPL profile and CD control become extremely difficult with a long over-etch process.

FIG. 1A illustrates a top view showing the relative positions of fins 101, dielectric layer 103, and recesses 105 from the cross sectional view of FIG. 1B showing a conventional etch process portion of a fabrication process of a semiconductor device. As shown in FIG. 1A, fins 101 are separated by a dielectric layer 103, and recesses 105 are formed in the dielectric layer 103 on each side of each fin 101. Each of the recesses 105 is intended for a replacement metal gate (not shown) to be formed therein. As illustrated in FIG. 1B, sidewall spacers 107 are formed on each side of each recess 105. A high-k dielectric liner 109 is formed in each recess 105 and on a top surface of each of the fins 101, and a metal liner 111 is formed over the high-k dielectric layer 109. After the OPL and ARC (not shown for illustrative convenience) are removed by plasma etching or reactive ion etching, the metal liner in some of the gate recesses 105 is removed by a wet etching technique. However, the remaining OPL residue 113 at the bottoms of the recesses 105 will undesirably block or prevent the wet etching underneath the residual OPL 113.

Therefore, there is a need in the art for methodology enabling short duration over-etch that leaves no OPL residue in the recess bottoms and concurrently controls OPL CD and profile at the critical block level.

SUMMARY

An aspect of the present disclosure is an OPL etch process that improves the CD profile of block level patterning and reduces WFM residues.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a plurality of fins separated by a dielectric layer; forming a recess in the dielectric layer on each side of each fin, each recess being for a metal gate; forming sidewall spacers on each side of each recess; depositing a high-k dielectric liner in each recess and on a top surface of each of the fins; depositing a metal liner over the high-k dielectric layer; depositing a non-conformal organic layer (NCOL) over a top surface of the dielectric layer to pinch-off a top of each recess; depositing an OPL and ARC over the NCOL; etching the OPL, ARC and NCOL over a portion of the dielectric layer and recesses in a first region; and etching the portion of the recesses to remove a residual amount of NCOL present at a bottom of each recess of the portion of the recesses.

Aspects include the dielectric layer including a $SiO_2$ layer. Further aspects include the sidewall spacers including SiN. Other aspects include the metal liner including a work function metal. Additional aspects include the NCOL including a PVD carbon, CVD carbon or plasma polymer including $CF_x$, $HBr_x$ or $CH_xF_y$. Another aspect includes the etching of the recesses including plasma etching (PE) or reactive ion etching (RIE) to remove the residual amount of NCOL present at the bottom of each recess. A further aspect includes the step of depositing the OPL by spin coating over the NCOL. Another aspect includes the etching of the OPL, ARC and NCOL including depositing a photoresist over the ARC with an opening over the portion of the dielectric layer and recesses and etching through the photoresist. Other aspects include wet etching to remove the metal liner from the portion of the dielectric layer and recesses. Additional aspects include removing any remaining OPL, ARC and NCOL over a remaining portion of the dielectric layer and recesses.

Another aspect of the present disclosure is a method including forming a plurality of fins separated by a dielectric layer; depositing a NCOL over an upper surface of the dielectric layer to pinch-off a top of each recess on each side of each of the fins; depositing an OPL and ARC over the NCOL; etching the OPL, ARC and NCOL over a portion of the dielectric layer and recesses in a first region; and etching the portion of the recesses to remove a residual amount of NCOL present at a bottom of each recess of the portion of the recesses.

Aspects include the dielectric layer including a $SiO_2$ layer. Further aspects include prior to depositing the NCOL, depositing a high-k dielectric liner in each recess; and depositing a metal liner over the high-k dielectric layer, wherein each recess is for a metal gate. Additional aspects include the NCOL including a PVD carbon, CVD carbon or plasma polymer including $CF_x$, $HBr_x$ or $CH_xF_y$. Another aspect includes the etching of the recesses including plasma etching (PE) or reactive ion etching (RIE) to remove the residual amount of NCOL present at the bottom of each recess. A further aspect includes the step of depositing the OPL including depositing a polymer by spin coating the OPL over the NCOL. Another aspect includes the etching of the OPL, ARC and NCOL including depositing a photoresist over the ARC with an opening over the portion of the dielectric layer and recesses and etching through the photoresist. Other aspects include wet etching to remove the metal liner from the portion of the dielectric layer and recesses. Additional aspects include the metal liner layer being a work function metal including TiN.

Yet another aspect of the present disclosure is a method including: forming a plurality of fins in a silicon layer, each fin separated by a dielectric layer, each fin including a recess on each side; depositing a high-k dielectric layer in each recess and on a top surface of each of the fins; depositing a metal liner over the high-k dielectric layer; depositing a NCOL over a top surface of the dielectric layer to pinch-off a top of each recess; depositing an OPL and ARC over the NCOL; plasma etching or reactive ion etching the OPL, ARC and NCOL over a portion of the dielectric layer and recesses in a first region; etching the portion of the recesses to remove a residual amount of NCOL present at a bottom of each recess of the portion of the recesses; and wet etching the portion of the dielectric layer and recesses to remove the metal liner.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the problem of OPL and WFM residue remaining in recesses between fins attendant upon removing the OL in block level patterning.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
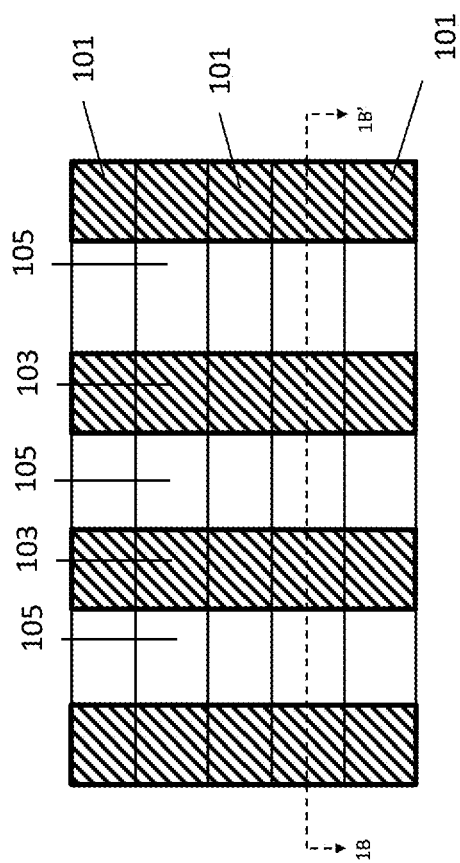
FIGS. 1A and 1B schematically illustrate top and cross sectional view of a conventional etch process portion of a fabrication process of a semiconductor device.
Figure 1B:
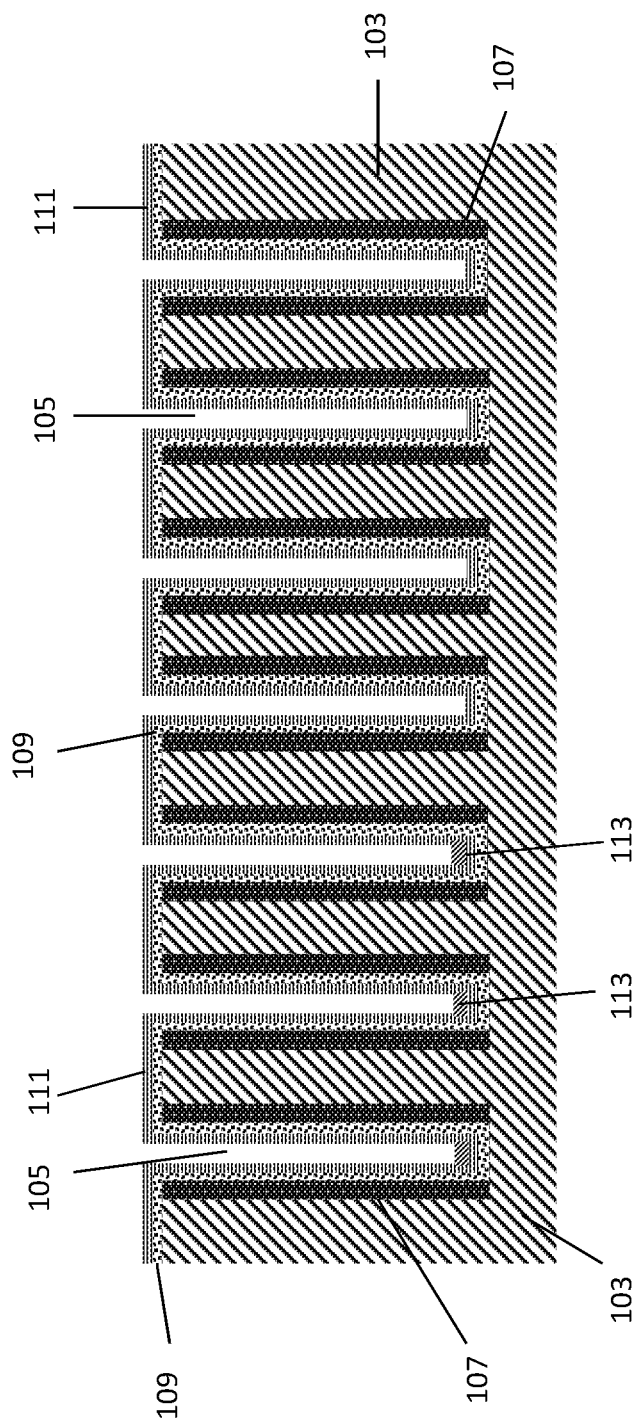
Figure 2:
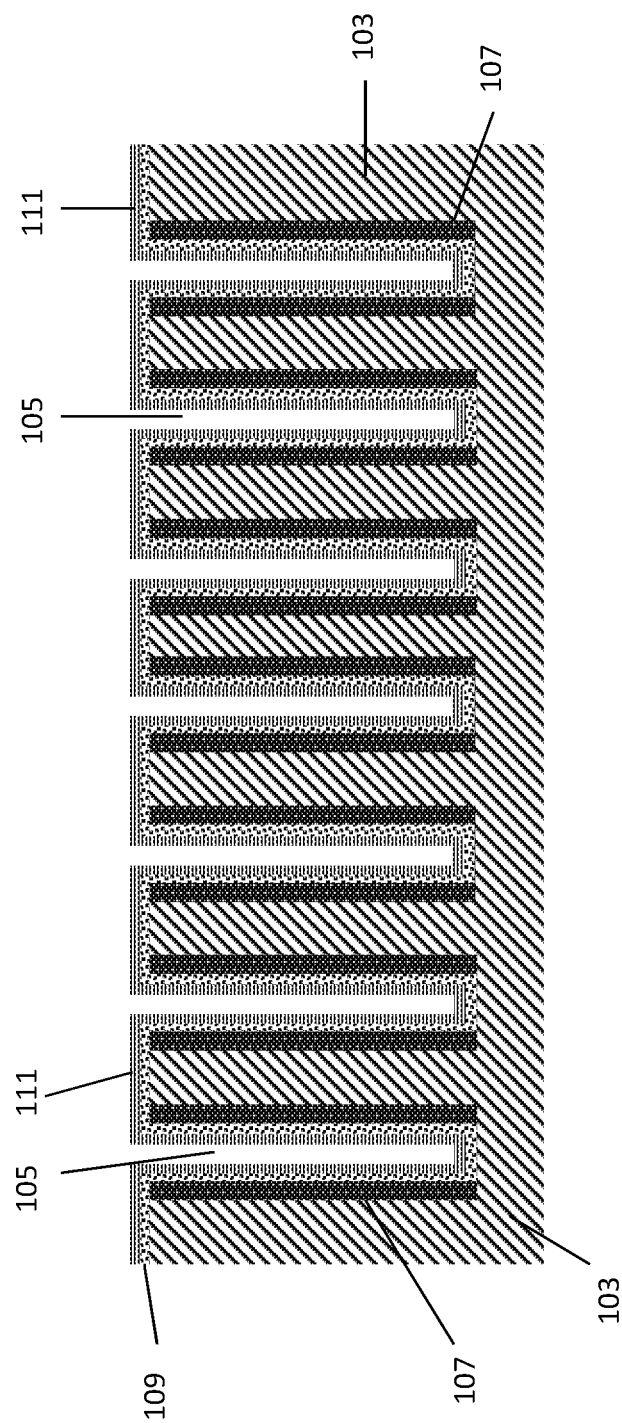
FIGS. 2 through 8 schematically illustrate cross sectional views of a process flow of a OPL etch process, in accordance with an exemplary embodiment.

Attention is directed to FIG. 2 which illustrates a cross sectional view of a portion of an OPL process flow for the fabrication of a semiconductor device. Fins (not shown for illustrative convenience) are separated by a dielectric layer 103, and recesses 105 are formed in the dielectric layer 103 on each side of each fin. Each of the recesses 105 is intended for a metal gate (not shown) to be formed therein. Sidewall spacers 107 are formed on each side of each recess 105 and can include SiN. A high-k dielectric liner 109 is formed in each recess 105 and on a top surface of each of the fins 101 and a metal liner 111 is formed over the high-k dielectric layer 109. The term high-k dielectric refers to a material with a dielectric constant K greater than that of silicon dioxide. The metal liner 111 is a work function metal, such as but not limited to titanium nitride (TiN).

The fins are formed in a silicon layer, with the dielectric layer 103 (an interlayer dielectric (ILD)) formed in between. The dielectric layer 103 in this example includes $SiO_2$. The recesses 105 are formed in the dielectric layer 103 on opposite sides of the fins 101 to eventually form metal gates.

Figure 3:
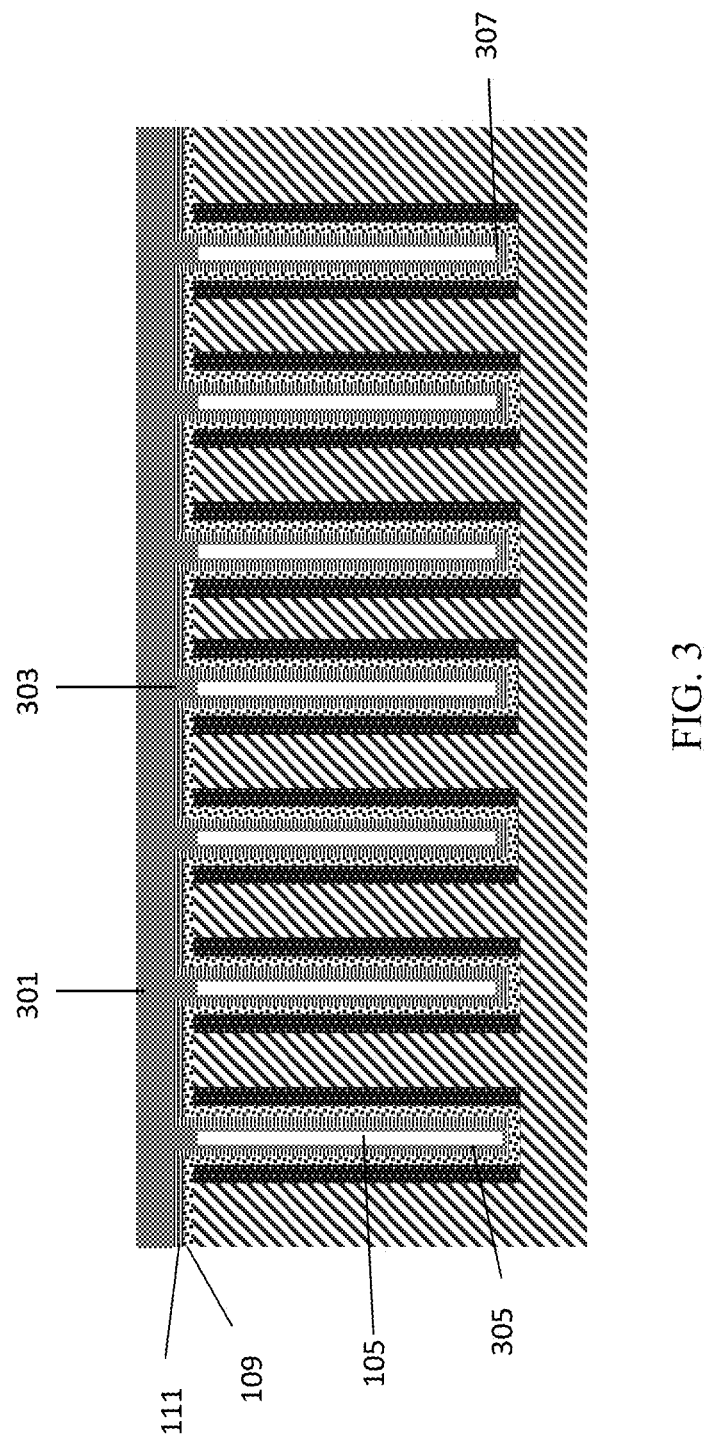

Adverting to FIG. 3, a NCOL deposition occurs. The purpose of the NCOL 301 is to pinch-off a top of the recesses 105 intended for the metal gate such that a negligible amount (residual amount) of the NCOL 301 is deposited in the sides 305 and bottom 307 of each recess 105. Examples of the material used for the NCOL include a carbon layer such as PVD carbon, CVD carbon, or a plasma polymer (CFx, HBrx, CHxFy) which can be deposited by a plasma process to a thickness on an upper surface of the metal liner of 5 to 50 nm. The residual amount of the NCOL deposited on the sides 305 and bottom 307 of each recess 105 ranges in thickness of 0.2 to 5 nm. The pinched-off portion 303 of the NCOL extends down in each recess to a depth of 1 to 30 nm.

Figure 4:
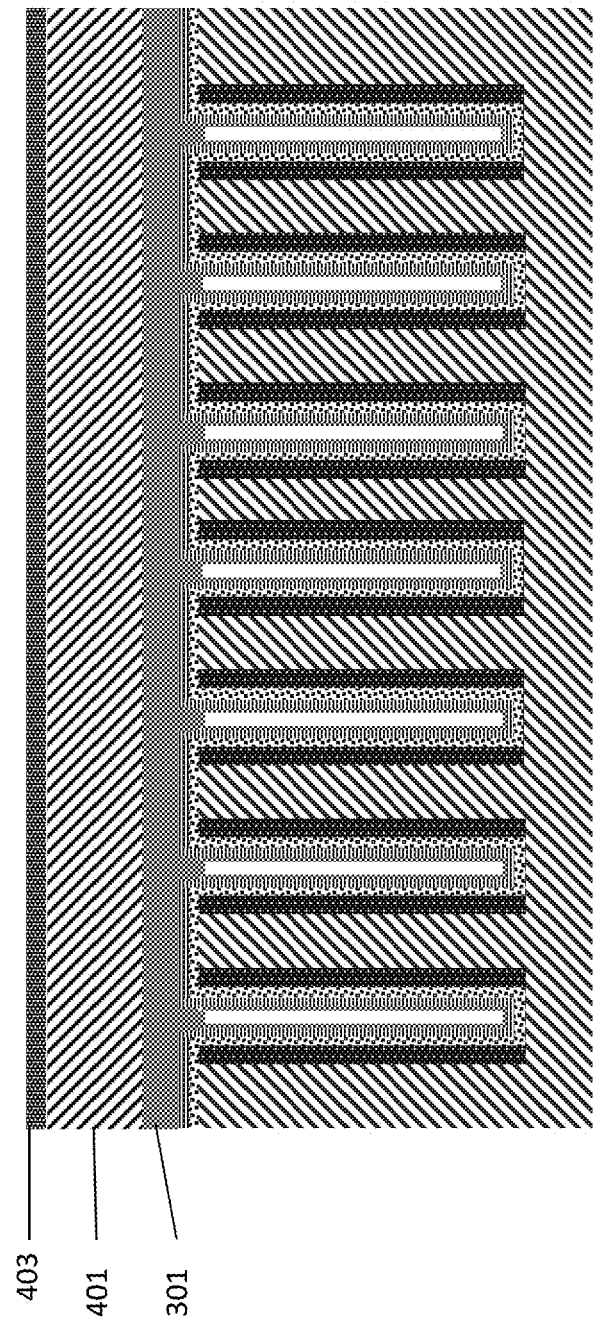

Adverting to FIG. 4, an OPL 401 is deposited over the NCOL 301 and an ARC 403 is subsequently deposited over the OPL 401. The OPL 401 is deposited by spin coating to a thickness of 20 to 200 nm and includes materials such as a carbon-rich material. The ARC 403 is deposited to a thickness of 10 to 50 nm and includes materials such as Si-containing or Ti-containing material.

Figure 5:
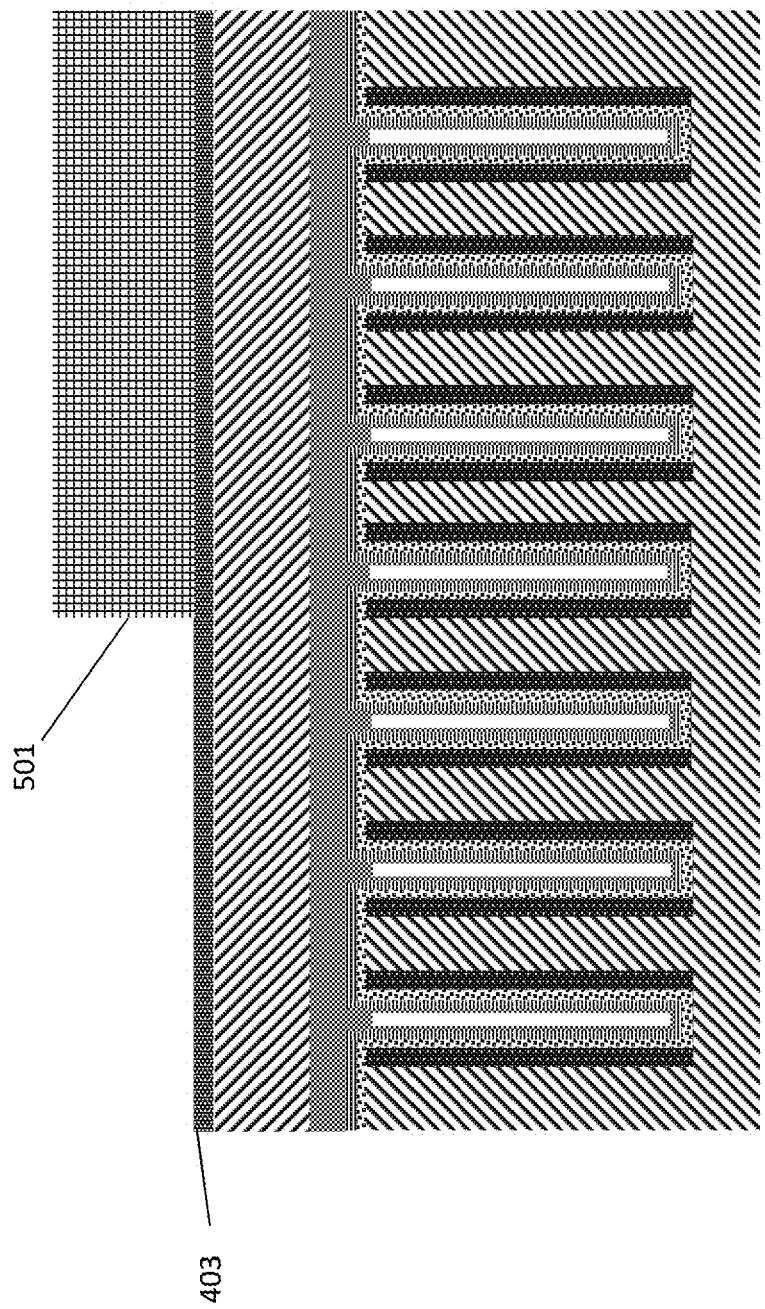

In FIG. 5, a photoresist 501 is deposited and patterned over the ARC 403. The photoresist 501 is then selectively exposed to radiation such as ultraviolet light, electrons, or x-rays. After exposure, the photoresist 501 is subjected to development which removes unwanted areas of the PR layer, exposing the corresponding areas of the underlying layer. The areas with no resist material left on top of them are then subjected to further processing. In FIG. 5, portions of the ARC 403 and OPL 301 are lithographically removed over a portion of the recesses 105 in accordance with the pattern in the photoresist 501. The photoresist 501 is subsequently removed.

Figure 6:
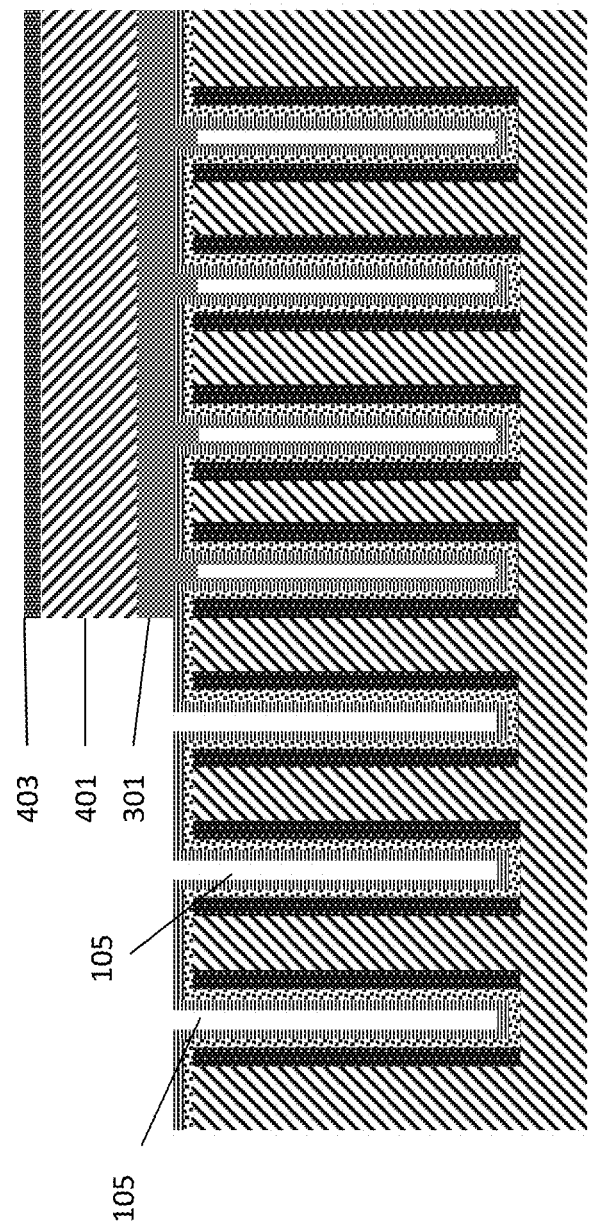

Adverting to FIG. 6, an etching step is performed in the recesses 105 to remove the residual amount of NCOL present at the sides and bottom of each recess 105. The etching step includes PE or RIE to remove the residual amount of NCOL 301 present at the bottom of each recess 105. It is not necessary to perform a long over etch to remove the residual amount of NCOL 301 present in the recesses 105. A relatively short over etch, e.g. 10 seconds, is performed to maintain the vertical OPL profile. The RIE uses chemically reactive plasma to remove the residual NCOL 301 material deposited on the sides and bottom of the exposed recesses 105. The plasma in the RIE etch is generated under low pressure (vacuum) by an electromagnetic field. Gas pressure is typically maintained in a range between a few millitorr and a few hundred millitorr by adjusting gas flow rates and/or adjusting an exhaust orifice. If PE is used, a plasma is produced from a process gas, typically oxygen or a fluorine-bearing gas, using a high frequency electric field, typically 13.56 MHz.

Figure 7:
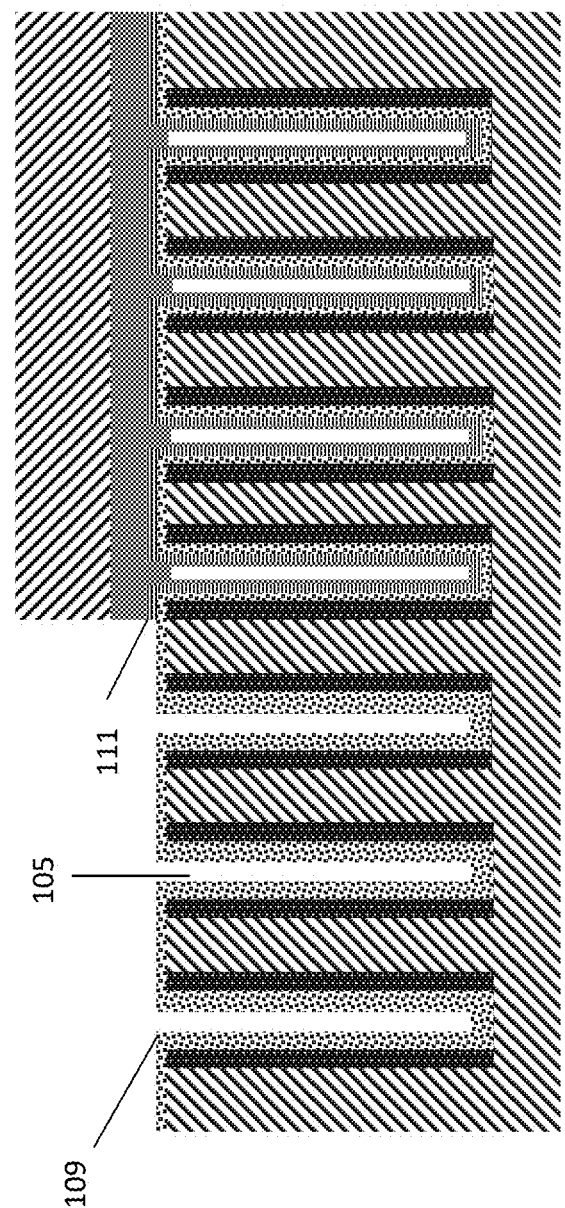
Figure 8:
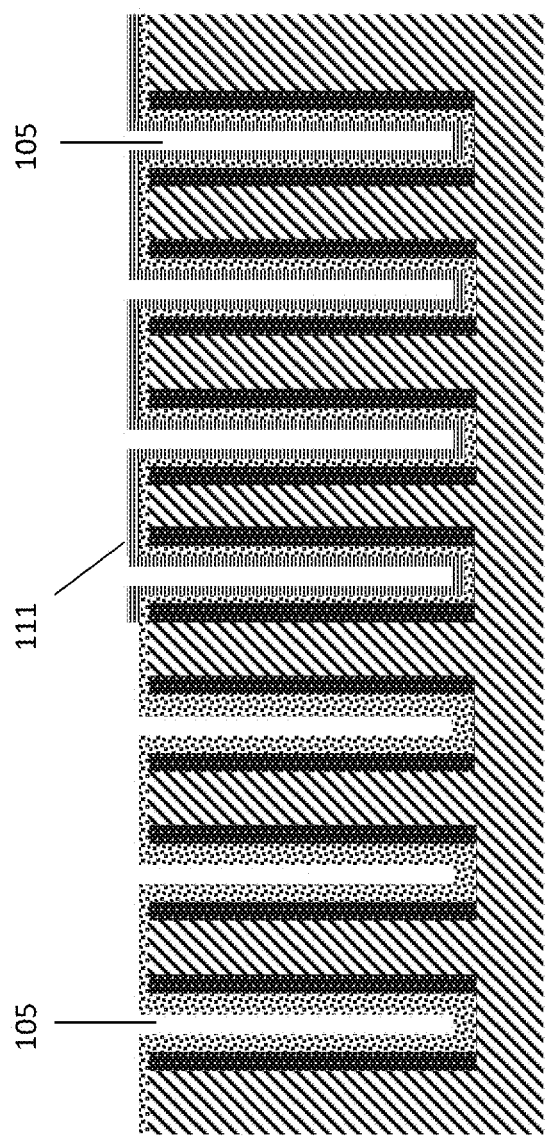

In FIG. 7, a wet etching technique is performed to remove the exposed metal liner 111 on the portion of recesses 105. The high-k dielectric layer 109 is left exposed after removal of the metal liner 111. Wet etching of metal nitrides, such as TiN, can be carried out using either an aqueous mixture of ammonium hydroxide and hydrogen peroxide, or a mixture of sulfuric acid and hydrogen peroxide with varying etch selectivities relative to other materials. The ARC is also shown removed in FIG. 7. In FIG. 8, the OPL and NCOL over the remaining recess portions are removed. Additional processing of the recesses 105 to form metal gate structures can then be performed by conventional techniques.

The embodiments of the present disclosure can achieve several technical effects, such as providing an OPL etch process that improves the CD profile of block level patterning and reduces WFM residues. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in the manufacture of any of various types of highly integrated semiconductor devices by way of the disclosed OPL etch process.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method, comprising:
   forming a plurality of fins separated by a dielectric layer;
   forming a recess in the dielectric layer on each side of each fin, each recess being for a metal gate;
   forming sidewall spacers on each side of each recess;
   depositing a high-k dielectric liner in each recess and on a top surface of each of the fins;
   depositing a metal liner over the high-k dielectric layer;
   depositing a non-conformal organic layer (NCOL) over a top surface of the dielectric layer to pinch-off a top of each recess, wherein a residual amount of the NCOL covers side and bottom surfaces of each recess;
   depositing an optical planarization layer (OPL) and anti-reflective coating (ARC) over the NCOL;
   etching the OPL, ARC and NCOL over a portion of the dielectric layer and recesses in a first region; and
   etching the portion of the recesses to remove the residual amount of the NCOL present at the side and bottom surfaces of each recess of the portion of the recesses.

2. The method of claim 1, wherein the dielectric layer comprises a $SiO_2$ layer.

3. The method of claim 1, wherein the sidewall spacers comprise SiN.

4. The method of claim 1, wherein the metal liner comprises a work function metal.

5. The method of claim 1, wherein the NCOL comprises a PVD carbon, CVD carbon or plasma polymer comprising CFx, HBrx or CHxFy.

6. The method of claim 1, wherein the etching of the recesses comprises plasma etching (PE) or reactive ion etching (RIE) to remove the residual amount of NCOL present at the bottom of each recess.

7. The method of claim 1, wherein the step of depositing the OPL comprises depositing a polymer by spin coating the OPL over the NCOL.

8. The method of claim 1, wherein the etching of the OPL, ARC and NCOL comprises depositing a photoresist over the ARC with an opening over the portion of the dielectric layer and recesses and etching through the photoresist.

9. The method of claim 8, further comprising wet etching to remove the metal liner from the portion of the dielectric layer and recesses.

10. The method of claim 9, further comprising removing any remaining OPL, ARC and NCOL over a remaining portion of the dielectric layer and recesses.

11. A method, comprising:
    forming a plurality of fins separated by a dielectric layer;
    depositing a non-conformal organic layer (NCOL) over an upper surface of the dielectric layer to pinch-off a top of each recess on each side of each of the fins, wherein a residual amount of the NCOL covers side and bottom surfaces of each recess;
    depositing an optical planarization layer (OPL) and anti-reflective coating (ARC) over the NCOL;
    etching the OPL, ARC and NCOL over a portion of the dielectric layer and recesses in a first region; and
    etching the portion of the recesses to remove the residual amount of the NCOL present at the side and bottom surfaces of each recess of the portion of the recesses.

12. The method of claim 11, wherein the dielectric layer comprises a $SiO_2$ layer.

13. The method of claim 11, further comprising:
    prior to depositing the NCOL, depositing a high-k dielectric layer in each recess; and
    depositing a metal liner over the high-k dielectric layer, wherein each recess is for a metal gate.

14. The method of claim 13, wherein the NCOL comprises a PVD carbon, CVD carbon or plasma polymer comprising CFx, HBrx or CHxFy.

15. The method of claim 14, wherein the etching of the recesses comprises plasma etching (PE) or reactive ion etching (RIE) to remove the residual amount of NCOL present at the bottom of each recess.

16. The method of claim 11, wherein the step of depositing the OPL comprises depositing a polymer by spin coating the OPL over the NCOL.

17. The method of claim 11, wherein the etching of the OPL, ARC and NCOL comprises depositing a photoresist over the ARC with an opening over the portion of the dielectric layer and recesses and etching through the photoresist.

18. The method of claim 17, further comprising wet etching to remove the metal liner from the portion of the dielectric layer and recesses.

19. The method of claim 18, wherein the metal liner layer comprises a work function metal comprising TiN.

20. A method, comprising:
    forming a plurality of fins in a silicon layer, each fin separated by a dielectric layer, each fin including a recess on each side of each fin;
    depositing a high-k dielectric liner in each recess and on a top surface of each of the fins;

depositing a metal liner over the high-k dielectric layer;
depositing a non-conformal organic layer (NCOL) over a top surface of the dielectric layer to pinch-off a top of each recess, wherein a residual amount of the NCOL covers side and bottom surfaces of each recess;
depositing an optical planarization layer (OPL) and anti-reflective coating (ARC) over the NCOL;
plasma etching or reactive ion etching the OPL, ARC and NCOL over a portion of the dielectric layer and recesses in a first region;
etching the portion of the recesses to remove the residual amount of the NCOL present at the side and bottom surfaces of each recess of the portion of the recesses; and
wet etching the portion of the dielectric layer and recesses to remove the metal liner.

\* \* \* \* \*